(12) United States Patent
Ratnam

(10) Patent No.: US 6,236,608 B1
(45) Date of Patent: May 22, 2001

(54) TECHNIQUE TO IMPROVE THE SOURCE LEAKAGE OF FLASH EPROM CELLS DURING SOURCE ERASE

(75) Inventor: Perumal Ratnam, Fremont, CA (US)

(73) Assignee: Alliance Semiconductor, San Jose, CA (US)

( * ) Notice: Subject to any disclaimer, the term of this patent is extended or adjusted under 35 U.S.C. 154(b) by 0 days.

(21) Appl. No.: 09/375,702

(22) Filed: Aug. 16, 1999

(51) Int. Cl.[7] .................................................. G11C 13/00
(52) U.S. Cl. ............................................ 365/218; 365/226
(58) Field of Search ............................... 365/218, 185.33, 365/185.29, 226

(56) References Cited

U.S. PATENT DOCUMENTS

| | | | |
|---|---|---|---|
| 5,120,671 | 6/1992 | Tang et al. | 437/43 |
| 5,470,773 | 11/1995 | Liu et al. | 437/43 |
| 5,791,204 | * 11/1999 | Haaa | 365/218 |
| 6,005,809 | * 12/1999 | Sung et al. | 365/218 |

OTHER PUBLICATIONS

Chang, et al., "Corner–Field Induced Drain Leakage In Thin Oxide MOSFETs," *IEDM Technical Digest*, 31.2, pp. 714–717 (1987).

Kume, et al., "A Flash–Erase EEPROM Cell With an Asymmetric Source and Drain Structure," *IEDM Technical Digest* 25.8, pp. 560–563 (1987).

Yokozawa, et al., "Low–Field–Stress Erasing Scheme for Highly–Reliable Flash Memories," NEC ULSI Device Development Laboratories, 24 pages, Feb. 12, 1997.

* cited by examiner

*Primary Examiner*—Terrell W. Fears
(74) *Attorney, Agent, or Firm*—Beyer Weaver & Thomas, LLP

(57) ABSTRACT

In one aspect, the present invention provides a method for erasing a semiconductor device that comprises applying a voltage pulse at the source of the semiconductor device and a multiple step voltage pulse of the opposite polarity at the gate of the semiconductor device. The multiple step voltage pulse comprises at least a first voltage pulse and a second voltage pulse at the gate of the semiconductor device. The second voltage pulse is usually greater in magnitude than the first voltage pulse. In another aspect, the present invention provides a method for erasing a semiconductor device that comprises applying a substantially constant positive voltage pulse for a first time interval, $t_1$, at the source of the semiconductor device. A first and then a second negative voltage pulse are also applied at the gate of the semiconductor device for a second and third time interval, $t_2$ and $t_3$, respectively. The second negative voltage pulse is greater in magnitude than the first negative voltage pulse. The negative and positive voltage pulses are substantially coincident in time.

28 Claims, 10 Drawing Sheets

TECHNIQUE TO IMPROVE THE SOURCE LEAKAGE OF FLASH EPROM CELLS DURING SOURCE ERASE

BACKGROUND OF THE INVENTION

1. Field of the Invention

The present invention relates to flash EPROM cells and methods for their construction. More particularly, the current invention relates to reducing leakage during source erase of a flash EPROM cell. More specifically, the present invention provides a new erase technique that reduces leakage during source erase of a flash EPROM cell.

2. Discussion of Related Art

Erasable programmable read-only memory (EPROM) is a form of non-volatile memory. Non-volatile memory devices retain information when power to the device is interrupted and are important in the design of wireless and portable electronic devices. Non-volatile storage choices range from mask read-only memory (ROM), ultraviolet EPROM (UV-EPROM), flash EPROM and electrically erasable EPROM (EEPROM).

EPROM devices typically lack the density of ROM disks but are more flexible since coded changes can be readily accommodated. EPROM devices offer the further advantage of rapid access since reading and writing to these types of devices is not delayed by latency periods.

Flash EPROM offers some of the advantages of EEPROM with the lower cost of UV-EPROM. All forms of EPROM use electrical injection methods to program individual memory cells but differ in the method of memory cell erasure. Ultraviolet light irradiation is used to erase UV-EPROM memory cells. This method is non-selective and requires removal of memory cells from the system for erasure. EEPROM systems use Fowler-Nordheim tunneling to erase single cells which offers reprogramming flexibility, high density and convenience, since removal of memory cells from the device is not required for erasure.

Flash EPROM also uses Fowler-Nordheim tunneling for non-selective memory cell erasure. Thus, flash EPROM provides the convenience and high density of EEPROM with the low cost of conventional UV-EPROM. Therefore, flash EPROM has become the storage method of choice in many portable consumer devices such as cell phones and hand held personal computers.

Two different methods, which employ Fowler-Nordheim tunneling, are typically used to erase flash EPROM cells. In channel or substrate erase, a positive bias of about 10.0 V is applied to the substrate of the memory cell. Similarly, a negative bias of about −5.0 V is applied to the gate of the memory cell. Electron tunneling from the gate to the substrate then erases the memory cell. Channel erase requires source isolation by the triple well process, which is complicated and expensive.

Source erase is identical to substrate erase except that a positive bias of about 5.0 V is applied to the source of the memory cell while a negative bias of about −10.0 V is applied to the gate of the memory cell. Since source erase does not require source isolation by the triple well process it is simpler and less expensive to implement than channel erase.

However, a significant problem with source erase of flash EPROM cells is source diode leakage to the substrate during erasure. Source diode leakage lengthens the time required to erase a flash EPROM, degrades performance and must be minimized to increase source erase speed.

Three different mechanisms have been identified as contributing to source diode leakage during source erase. Thermal leakage, which is intrinsic to any tunneling process, is small and independent of electric field. Avalanche multiplication is electric field dependent and can become very large if the cell is not optimized during fabrication.

Band to band tunneling leakage is a fundamental problem with source erase, particularly at high electrical field and reduced channel width (C. Chang et al., *Tech. Dig. IEDM,* 714, 1987; H. Kume et al., *Tech. Dig. IEDM,* 560, 1987). Band to band tunneling leakage wastes power since some of the diode current is dissipated in the substrate during erasure. Furthermore, constant source voltage is difficult to maintain in the presence of this type of leakage, which places significant demand on the charge pump capacitor. Thus, the difficulties caused by band to band leakage in generating and maintaining the voltage required to erase the device are frequently the limiting factor in erasure of flash EPROM cells.

FIG. 1 illustrates a conventional method used to erase a flash EPROM cell. Shown in FIG. 1 are conventional source and gate pulse profiles as a function of time. The source pulse height 102 is about 5.0 V while the gate pulse height 104 is about −10.0 V during memory cell erasure. The gate pulse height 102 and source pulse height 104 strongly affect the erase speed and are typically adjusted to maximize electron tunneling from the floating gate to the source. However, optimizing erasure rate increases the magnitude of the source to gate electric field, thus causing significant band to band tunneling leakage.

The relationship of conventional erase techniques and band to band tunneling leakage may be understood with reference to FIGS. 2, 3 and 4. Shown in FIG. 2 is a stacked gate 220 disposed on a semiconductor substrate 212. The stacked gate 220 may be made by conventional methods well known in the art. Stacked gate 220 is comprised of tunnel oxide layer 204, a floating gate 206, insulating layer 208 and the control gate 210. Floating gate 206 and control gate 210 are typically different polysilicon layers. Source 216 forms an electrical junction with the stacked gate 220 at the source edge 222 under the stacked gate edge 224.

Typically, in a programmed cell a residual electric field of about −2.0 V to about −3.0 V exists between the source 216 and the stacked gate 220. Thus, applying a voltage of between about −10.0 V and about −12.0 V to the control gate 210 instantaneously results in an effective voltage of between about −12.0 V to about −15.0 V in floating gate 206. Therefore, a high electric field exists in the floating gate 206 upon initial voltage application until some of the electrons tunnel to source 216. The voltage in the floating gate eventually reaches a constant value as excess electrons tunnel to the source.

The dependence of floating gate voltage on time after initial voltage application to the control gate is graphically depicted in FIG. 3. The vertical axis represents the voltage of the floating gate while the horizontal axis represents time. Line 302 in FIG. 3 reaches a constant value as a function of time. The electric field in the floating gate changes from an initial value of about −12.0 V to a constant value of about −6.0 V within about 100 μsec. Thus, the electric field in the floating is diminished by a factor of about 2 during about 100 μsec. The change in voltage reflects tunneling of electrons to the source.

However, as previously mentioned, the high initial electric field in the floating gate results in a large source diode current due to band to band tunneling leakage. FIG. 4 graphically illustrates the relationship between source diode leakage caused by band to band tunneling as a function of time after initial application of voltage to the control gate. The horizontal axis represents the amount of leakage to the substrate from the source diode caused by band to band tunneling while the horizontal axis represents time. Line 402 rapidly decays from an initial value of about 100 $\mu$A to a constant value of about 10 nA in about 100 $\mu$sec. Thus, the amount of current leaked into the source is diminished by a factor of about ten in 100 $\mu$sec. As can be seen from FIG. 4 a significant percentage of source diode leakage occurs after initial application of voltage to the control gate.

FIGS. 3 and 4 demonstrate that a significant problem in source erase is the high initial electric field in the floating gate, which consequently results in high initial source diode leakage. As electrons are removed from the floating gate source diode leakage is also reduced.

It has become apparent that as flash EPROM devices shrink in size and increase in density that new methods of reducing source diode leakage are necessary. Thus, what is needed is a new erase technique that minimizes band to band tunneling leakage during source erase. More particularly, what is required is a method that reduces the magnitude of source diode leakage caused by high initial electric field in the floating gate

SUMMARY OF THE INVENTION

The present invention addresses this need by providing a new method that reduces initial source diode leakage by varying the gate pulse height during source erase while the source pulse height is held substantially constant. Importantly, the method of the present invention reduces source diode leakage caused by high initial electric field in the floating gate.

The method of the current invention provides a first voltage pulse of low magnitude to the gate of the semiconductor device, which reduces the initial electric field in the floating gate in comparison to prior art methods. Consequently, source diode leakage to the substrate is significantly diminished. Then, after the voltage of the floating gate has declined to a substantially constant value, a second voltage pulse of high magnitude is applied to the gate of the semiconductor device. Thus, the method of the present invention offers the advantage of rapid source erase with a high magnitude voltage pulse and low source diode leakage. Furthermore, the method of the current invention is most useful in modern semiconductor devices of decreasing channel length where the capacity of source charge pumps is particularly limited.

In one aspect, the present invention provides a method for erasing a semiconductor device that includes applying a voltage pulse at the source of the semiconductor device and a multiple step voltage pulse of the opposite polarity at the gate of the semiconductor device. The multiple step voltage pulse includes at least a first voltage pulse and a second voltage pulse at the gate of the semiconductor device. The second voltage pulse is greater in magnitude than the first voltage pulse.

In a first embodiment, the multiple step voltage pulse applied at the gate includes applying the first voltage pulse for a first time interval, $t_1$, and the second voltage pulse for a second time interval, $t_2$. The voltage pulse at the source of the semiconductor device is applied for a third time interval, $t_3$. In this embodiment, a voltage pulse applied at the source of the semiconductor device is substantially constant, and the multiple step voltage pulse at the gate and the voltage pulse at the source are substantially coincidental in time ($t_1+t_2=t_3$). Note that this is not a required condition as $t_1+t_2$ may also be greater than or less than $t_3$.

In a second embodiment, the voltage pulse applied at the source of the semiconductor device includes applying a first voltage pulse for a first time interval, $t_1$, and a substantially identical second voltage pulse for a third time interval, $t_3$. A second time interval, $t_2$, where the voltage applied to the source is about zero separates $t_1$ and $t_3$. The multistep voltage pulse applied at the gate of the semiconductor device is substantially coincidental with $t_1+t_2+t_3$. In this embodiment, the multiple step voltage pulse includes applying a third voltage pulse for a fourth time interval, $t_4$, and a fourth higher voltage pulse for a fifth time interval, $t_5$, where $t_1+t_2+t_3=t_4+t_5$. Note that this is not a required condition as $t_1+t_2+t_3$ may also be greater or less than $t_4+t_5$.

In a third embodiment, the voltage pulse applied at the source of the semiconductor device includes applying a first voltage pulse for a first time interval, $t_1$, and a substantially identical second voltage pulse for a third time interval, $t_3$. A second time interval, $t_2$, where the voltage applied to the source is about zero separates $t_1$ and $t_3$. In this embodiment, the multiple step voltage pulse includes applying a third voltage pulse for a fourth time interval, $t_4$, and a fourth higher voltage pulse for a sixth time interval, $t_6$. A fifth time interval, $t_5$, the voltage applied to the gate is about zero separates $t_4$ and $t_6$. In this embodiment, $t_1+t_2+t_3=t_4+t_5+t_6$. Note that this is not a required condition as $t_1+t_2+t_3$ may also be greater than or less than $t_4+t_5+t_6$. The multiple step voltage pulse and the voltage pulse are substantially coincidental in time.

In another aspect, the present invention provides a method for erasing a semiconductor device that includes applying a substantially constant positive voltage pulse for a first time interval, $t_1$, at the source of the semiconductor device. A first and then a second negative voltage pulse are also applied at the gate of the semiconductor device for a second and third time interval, $t_2$ and $t_3$, respectively. The second negative voltage pulse is greater in magnitude than the first negative voltage pulse. The negative and positive voltage pulses are substantially coincidental in time.

BRIEF DESCRIPTION OF THE DRAWINGS

The invention will be better understood by reference to the following description taken in conjunction with the accompanying drawings in which.

DETAILED DESCRIPTION OF THE PREFERRED EMBODIMENTS

Reference will now be made in detail to preferred embodiments of the invention. Examples of preferred embodiments are illustrated in the accompanying drawings. While the invention will be described in conjunction with preferred embodiments, it will be understood that it is not intended to limit the invention to these preferred embodiments. To the contrary, it is intended to cover alternatives, modifications, and equivalents as may be included within the spirit and scope of the invention as defined by the appended claims.

The present invention provides a method that reduces initial source diode leakage by changing the gate pulse height during source erase while holding the source pulse height substantially constant. The method of the present invention reduces source diode leakage caused by high initial electric field in the floating gate.

Figure 5:
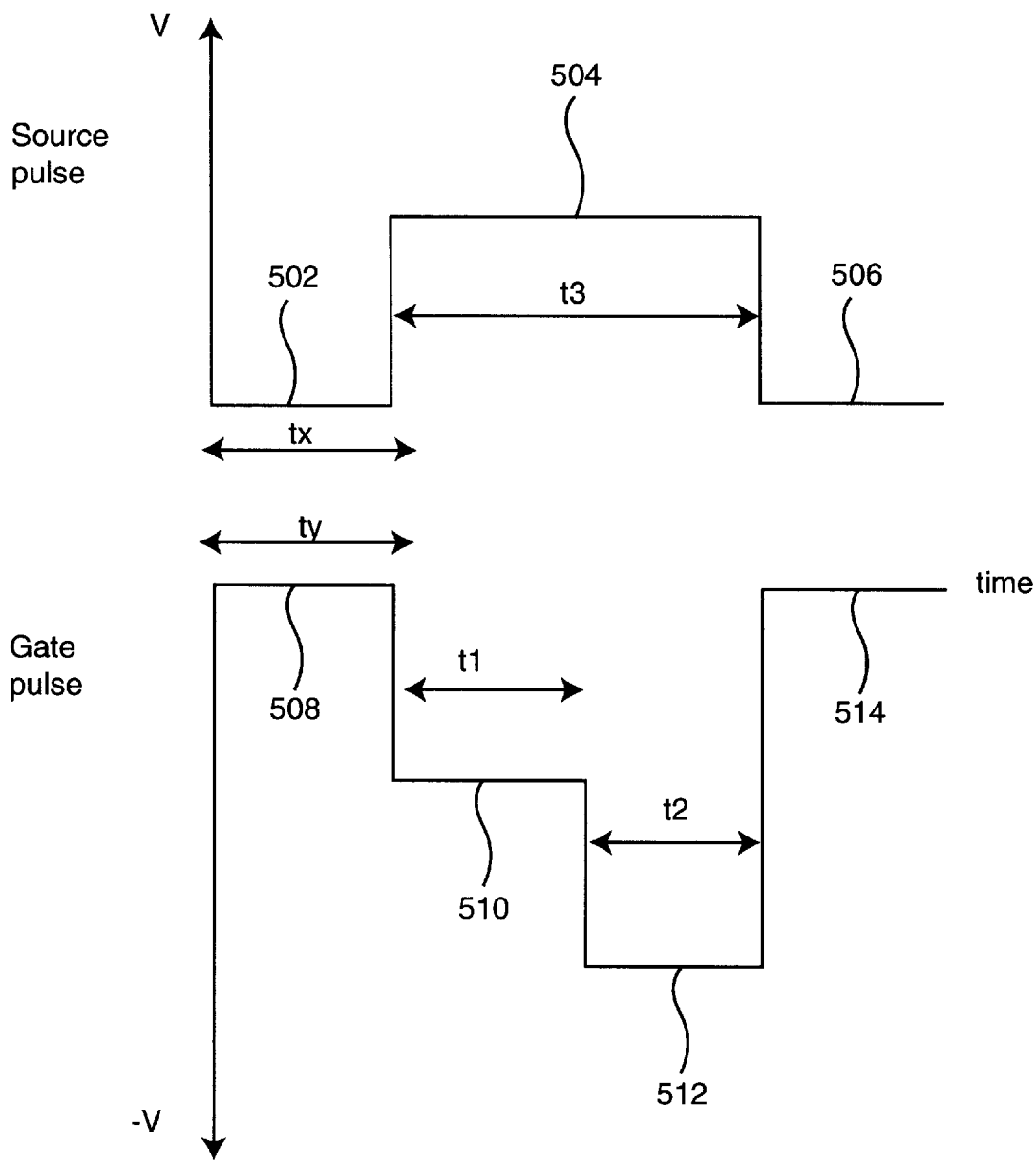
FIG. 5 illustrates source and gate pulse profiles as a function of time for a first embodiment of the present invention.

In a first embodiment, the present invention provides a method for erasing a semiconductor device that employs a multistep gate voltage pulse to minimize source diode leakage. FIG. 5 illustrates the source and gate pulse profiles of one embodiment of the current invention as a function of time.

Initially, the voltage 502 applied to the source of the semiconductor device is about zero. After a period of time represented by $t_x$ a voltage pulse 504 is applied to the source of a semiconductor device as shown in FIG. 5. The voltage pulse 504 may be equivalent to the maximum allowable source pulse height. In one embodiment, the voltage pulse 504 is between about 4.0 V and about 5.0 V. In a more specific embodiment, the voltage pulse 504 is about 4.5 V.

Voltage pulse 504 may be applied for a time interval, represented by $t_3$ in FIG. 5. In one embodiment, $t_3$ is between about 100 μsec and about 100 msec. In a more specific embodiment, $t_3$ is about 500 μsec. Voltage pulse 504 is substantially constant during time interval $t_3$. After time interval $t_3$ has elapsed, the voltage 506 applied to the source of the semiconductor device drops to about zero.

The initial voltage 508 applied to the gate of the semiconductor device is about zero. After a period of time represented by $t_y$, voltage pulse 510 is applied to the gate of the semiconductor device as shown in FIG. 5. The period of time $t_y$ may larger, smaller or equal to the period of time $t_x$. Generally, voltage pulse 510 will be less than the maximum allowable gate pulse height. In one embodiment, voltage pulse 510 is between about −4.0 V and about −6.0 V. In a more specific embodiment, voltage pulse 510 is about −5.0 V.

Voltage pulse 510 may be applied for a time interval represented by $t_1$ in FIG. 5. In one embodiment, $t_1$ is between about 250 μsec and about 500 μsec. In a more specific embodiment, $t_1$ is about 300 μsec. Voltage pulse 510 is substantially constant during time interval $t_1$.

After time interval $t_1$ has elapsed, voltage pulse 512 may be applied to the gate of the semiconductor device. Generally, voltage pulse 512 will be about the maximum allowable gate pulse height. Usually, voltage pulse 512 will be greater in magnitude than voltage pulse 510. In one embodiment, the voltage pulse is between about −9.0 V and about −11.0 V. In a more specific embodiment, voltage pulse 512 is about −10.0 V.

Voltage pulse 512 may be applied for a time interval, represented by $t_2$ in FIG. 5. In one embodiment, $t_2$ is between about 100 μsec and about 300 μsec. In a more specific embodiment, $t_2$ is about 200 μsec. Voltage pulse 510 is substantially constant during time interval $t_2$. After time interval $t_2$ has elapsed, the voltage 514 applied to the gate of the semiconductor device drops to about zero.

The source and gate voltage pulses will usually be applied at about the same time during source erasure, although this is not an essential condition. The time intervals for the source and gate voltage pulses may be about the same ($t_1+t_2=t_3$). Note that this is not a required condition as $t_1+t_2$ may also be greater than or less than $t_3$. In the exemplified embodiment, $t_1=t_2$ which also is not a required condition since $t_1$ may also be greater or less than $t_2$.

Importantly, the gate voltage pulse sequence may be applied in more than two steps. For example, the gate voltage pulse may be varied in a sequence comprising 0.0 V to −2.0 V to −5.0 V to −7.0 V to −10.0 V. Alternatively, the gate voltage may be steadily decreased from about 0.0 V to about −10.0 V without distinct steps, like a ramp voltage.

Figure 6:
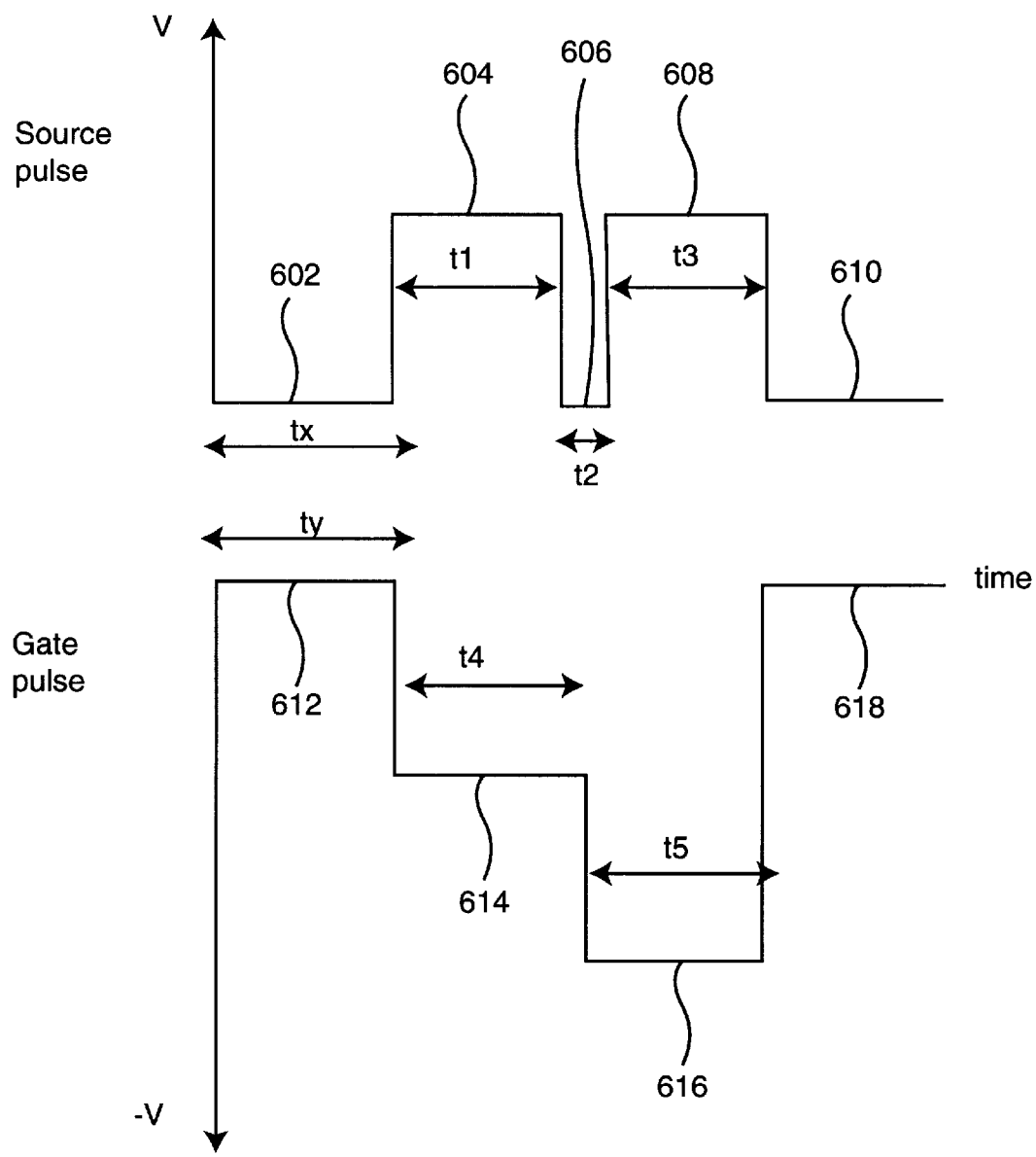
FIG. 6 illustrates source and gate pulse profiles as a function of time for a second embodiment of the present invention.

FIG. 6 illustrates the source and gate pulse profiles as a function of time for a second embodiment of the current invention. In this embodiment, the source pulse profile has been altered to reduce system noise due to switching of levels, which are derived from charge pumps.

Referring now to FIG. 6, the voltage 602 initially applied to the source of the semiconductor device is about zero. Voltage pulse 604 is then applied to the source of a semiconductor device after a period of time represented by $t_x$ as shown in FIG. 6. Voltage pulse 604 may be the maximum allowable source pulse height. In one embodiment, voltage pulse 604 is between about 4.0 V and about 5.0 V. In a more specific embodiment, voltage pulse 604 is about 4.5 V.

Voltage pulse 604 may be applied for a time interval, which is represented by $t_1$ in FIG. 6. In one embodiment, $t_1$ is between about 100 μsec and about 300 μsec. In a more specific embodiment, $t_1$ is about 200 μsec. Voltage pulse 604 is substantially constant for time interval $t_1$.

After time interval $t_1$ has elapsed, the voltage 606 applied to the source of the semiconductor device is reduced to about zero for a time interval represented by $t_2$ in FIG. 6. As explained before, voltage break 606 reduces system noise. Generally, $t_2$ is much smaller than $t_1$. In one embodiment, $t_2$ is between about 10 μsec and about 30 μsec. In a more specific embodiment, $t_2$ interval is about 20 μsec.

After time interval $t_2$ has elapsed, voltage pulse 608 is applied to the source of a semiconductor device as shown in FIG. 6. Voltage pulse 608 may be equivalent to the maximum allowable source pulse height. Usually, voltage pulse 608 is substantially identical to voltage pulse 604. In one embodiment, voltage pulse 608 is between about 4.0 V and about 5.0 V. In a more specific embodiment, voltage pulse 608 is about 4.5 V.

Voltage pulse 608 may be applied for a time interval represented by $t_3$ in FIG. 6. In one embodiment, $t_3$ is between about 100 μsec and about 300 μsec. In a more specific embodiment, $t_3$ is about 200 μsec. Voltage pulse 608 is substantially constant during time interval $t_3$. After time interval $t_3$ has elapsed, the voltage 610 applied to the gate of the semiconductor device drops to about zero.

The initial voltage 612 applied to the gate of the semiconductor device is about zero. After a period of time represented by $t_y$, voltage pulse 614 is applied to the gate of the semiconductor device as shown in FIG. 6. The period of time $t_y$ may larger, smaller or equal to the period of time $t_x$. Usually, voltage pulse 614 will be less than the maximum allowable gate pulse height. In one embodiment, voltage pulse 614 is between about −4.0 V and about −6.0 V. In a more specific embodiment, voltage pulse 614 is about −5.0 V.

Voltage pulse 614 may be applied for a time interval represented by $t_4$ in FIG. 6. In one embodiment, $t_4$ is between about 100 µsec and about 300 µsec. In a more specific embodiment, $t_4$ is about 210 µsec. Voltage pulse 614 is substantially constant during time interval $t_4$.

After time interval $t_4$ has elapsed, voltage pulse 616 may be applied to the gate of the semiconductor device. Generally, voltage pulse 616 will be about the maximum allowable gate pulse height. Usually, voltage pulse 616 is greater in magnitude than voltage pulse 614. In one embodiment, voltage pulse 616 is between about −9.0 V and about −11.0 V. In a more specific embodiment, voltage pulse 616 is about −10.0 V.

Voltage pulse 616 may be applied for a time interval, represented by $t_5$ in FIG. 6. In one embodiment, $t_5$ is between about 100 µsec and about 300 µsec. In a more specific embodiment, $t_5$ is about 210 µsec. Voltage pulse 616 is substantially constant during time interval $t_5$. After time interval $t_5$ has elapsed, the voltage 618 applied to the gate of the semiconductor device is reduced to about zero.

The source and gate voltage pulses will usually be applied at about the same time during source erasure, although this is not an essential condition. The time intervals for the source and gate voltage pulses may be about the same ($t_1+t_2+t_3=t_4+t_5$). Note that this is not a required condition as $t_1+t_2+t_3$ may also be greater or less than $t_4+t_5$. In the exemplified embodiment, $t_1=t_3$ and $t_4=t_5$ which also are not required conditions since $t_1$ may also be greater or less than $t_2$ and $t_4$ may also be greater or less than $t_5$.

Figure 7:
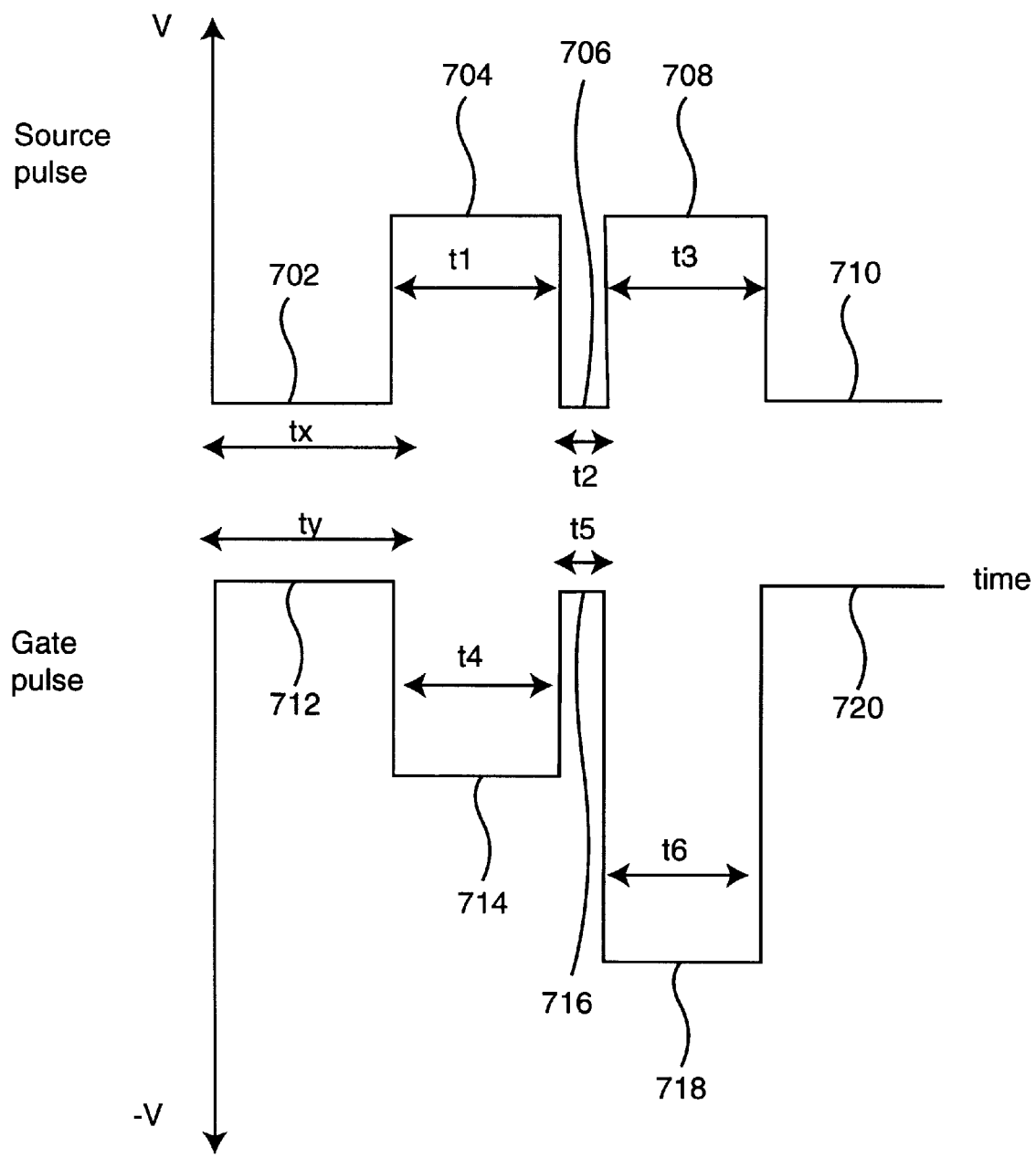
FIG. 7 illustrates source and gate pulse profiles as a function of time for a third embodiment of the present invention.

FIG. 7 illustrates the source and gate pulse profiles as a function of time for a third embodiment of the current invention. In this embodiment, both the source and gate pulse profiles have been altered to reduce system noise.

Referring now to FIG. 7, the voltage 702 initially applied to the source of the semiconductor device is about zero. Voltage pulse 704 is then applied to the source of a semiconductor device after a period of time represented by $t_x$ as shown in FIG. 7. Voltage pulse 704 may be the maximum allowable source pulse height. In one embodiment, voltage pulse 704 is between about 4.0 V and about 6.0 V. In a more specific embodiment, voltage pulse 704 is about 5.0 V.

Voltage pulse 704 may be applied for a time interval, which is represented by $t_1$ in FIG. 7. In one embodiment, $t_1$ is between about 100 µsec and about 300 µsec. In a more specific embodiment, $t_1$ is about 200 µsec. Voltage pulse 704 is substantially constant for time interval $t_1$.

After time interval $t_1$ has elapsed, the voltage 706 applied to the source of the semiconductor device is reduced to about zero for a time interval represented by $t_2$ in FIG. 7. Generally, $t_2$ is much smaller than $t_1$. In one embodiment, $t_2$ is between about 10 µsec and about 30 µsec. In a more specific embodiment, $t_2$ interval is about 20 µsec.

After time interval $t_2$ has elapsed, voltage pulse 708 is applied to the source of a semiconductor device as shown in FIG. 6. Voltage pulse 708 may be equivalent to the maximum allowable source pulse height. Usually, voltage pulse 708 is substantially identical to voltage pulse 704. In one embodiment, voltage pulse 708 is between about 4.0 V and about 6.0 V. In a more specific embodiment, voltage pulse 708 is about 5.0 V.

Voltage pulse 708 may be applied for a time interval represented by $t_3$ in FIG. 6. In one embodiment, $t_3$ is between about 100 µsec and about 300 µsec. In a more specific embodiment, $t_3$ is about 200 µsec. Voltage pulse 708 is substantially constant during time interval $t_3$. After time interval $t_3$ has elapsed, the voltage 710 applied to the source of the semiconductor device is reduced to about zero.

The voltage 712 initially applied to the gate of the semiconductor device is about zero. After a period of time represented by $t_y$ voltage pulse 714 is applied to the gate of a semiconductor device as shown in FIG. 7. The period of time $t_y$ may larger, smaller or equal to the period of time $t_x$. In one embodiment, voltage pulse 714 is between about −4.0 V and about −6.0 V. In a more specific embodiment, the first voltage pulse 714 is about −5.0 V.

Voltage pulse 714 may be applied for a time interval represented by $t_4$ in FIG. 7. In one embodiment, $t_4$ is between about 100 µsec and about 300 µsec. In a more specific embodiment, $t_4$ is about 200 µsec. Voltage pulse 714 is substantially constant during time interval $t_4$.

After $t_4$ has elapsed, the voltage 716 applied to the gate of the semiconductor device is reduced to about zero for a time interval represented by $t_5$ in FIG. 7. Voltage break 716, as explained before, causes system noise reduction. Usually, $t_5$ is much smaller than $t_4$. In one embodiment, time interval $t_5$ is between about 10 µsec and about 30 µsec. In a more specific embodiment, time interval $t_5$ is about 20 µsec.

After time interval $t_5$ has elapsed, voltage pulse 718 is applied to the gate of a semiconductor device as shown in FIG. 7. Usually, voltage pulse 718 is greater than voltage pulse 714. In one embodiment, voltage pulse 718 is between about −9.0 V and about −11.0 V. In a more specific embodiment, voltage pulse 718 is about −10.0 V.

Voltage pulse 718 may be applied for a time interval represented by $t_6$ in FIG. 7. In one embodiment, $t_6$ is between about 100 µsec and about 300 µsec. In a more specific embodiment, $t_6$ is about 200 µsec. Voltage pulse 718 is substantially constant during time interval $t_6$. After time interval $t_6$ has elapsed, the voltage 720 applied to the gate of the semiconductor device is reduced to about zero.

The source and gate voltage pulses will usually be applied at about the same time during source erasure although this is not an essential condition. The time intervals for the source and gate voltage pulses may be about the same ($t_1+t_2+t_3=t_4+t_5+t_6$). Note that this is not a required condition as $t_1+t_2+t_3$ may also be greater or less than $t_4+t_5+t_6$. In the exemplified embodiment, $t_1=t_3$, $t_2=t_5$ and $t_4=t_6$ which also are not required conditions since $t_1$ may also be greater or less than $t_3$, $t_2$ may also be greater or less than $t_5$ and $t_4$ may also be greater or less than $t_6$.

EXAMPLE

The following example describes specific aspects of the invention to illustrate the invention and also provide a description of the experimental conditions to aid those of skill in the art in understanding and practicing the invention. The example should not be construed as limiting the invention in any manner.

Figure 8A:
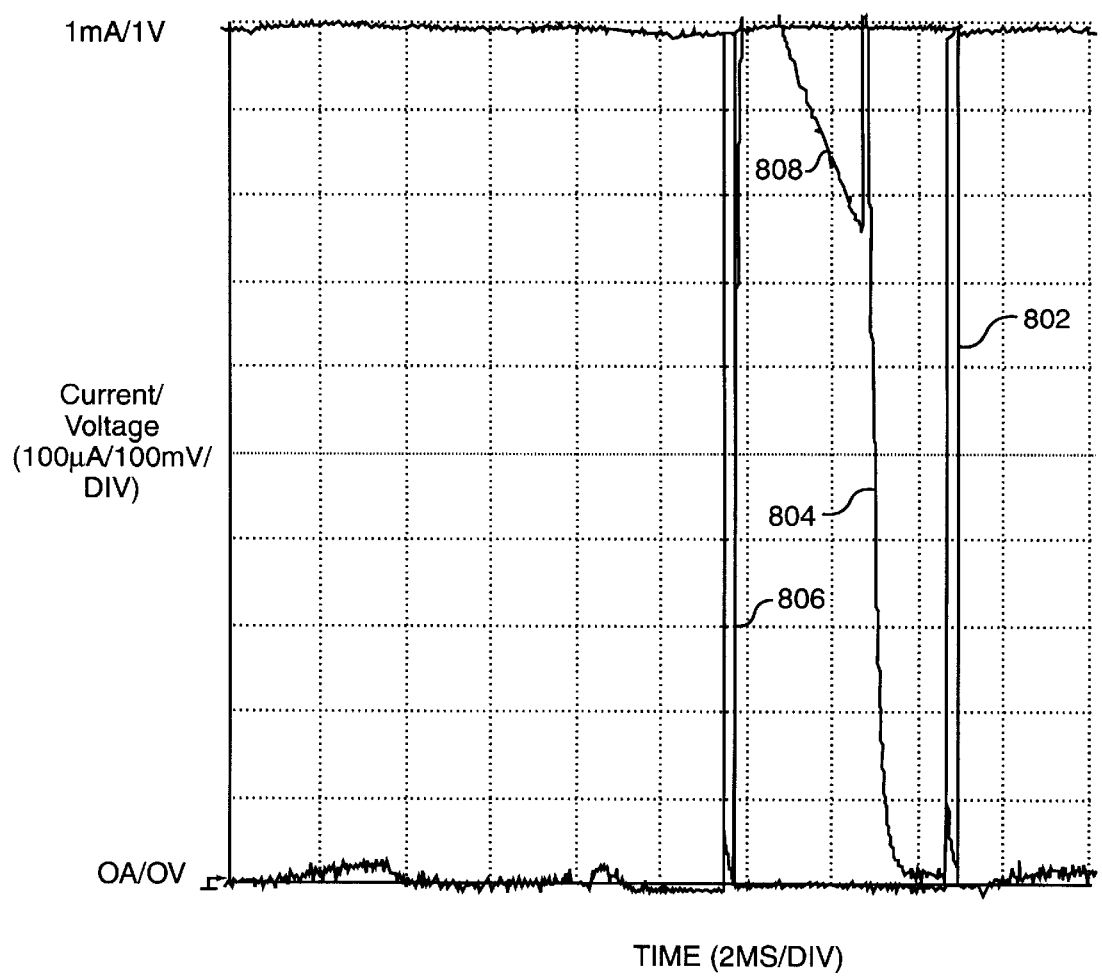
FIG. 8A illustrates a digitizing oscilloscope scan of source erasure for a prior art method.

FIG. 8A illustrates a digitizing oscilloscope scan using a prior art method for source erasure. The vertical axis represents source leakage current while the horizontal axis represents time.

Figure 8B:
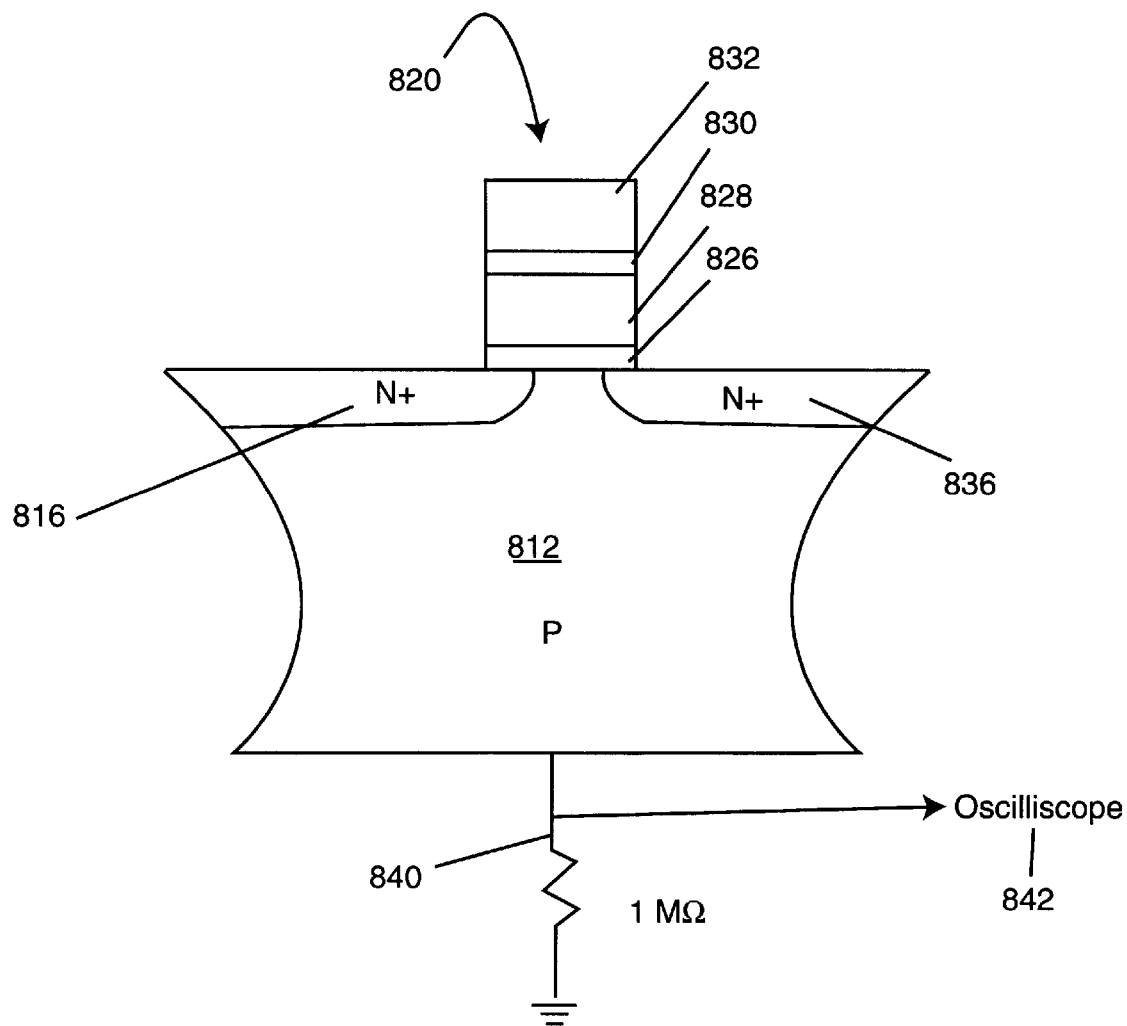
FIG. 8B illustrates source leakage measurement with a resistor at the substrate terminal.

The source leakage current is measured with a resistor at the substrate terminal as illustrated in FIG. 8B. Shown in FIG. 8B is a stacked gate 820 disposed on a semiconductor substrate 812. The stacked gate 820 may be made by conventional methods well known in the art. Stacked gate 820 is comprised of tunnel oxide layer 826, a floating gate 828, oxide layer 830 and the control gate 832. Floating gate 828 and control gate 832 are typically different polysilicon layers. Source 816 and drain 834 are partially disposed under the stacked gate 820. A source pulse is applied at source 816 and a gate pulse is applied at stacked gate 820. The source leakage is measure by resistor 840 attached to the substrate terminal as shown which is connected to oscilloscope 842.

Referring now to FIG. 8A, the resistance of the substrate used in this example was about 1 MΩ. Here, the voltage pulse 802 applied at the source is about 5.0 V for a time interval of 5.5 msec and is offscale since the scale of the vertical axis of the scan is from 0–1 V which is equal 0–1 $\mu$A. The gate is pulsed first at about −10.0 V for about 3.0 msec at 804 and at about −10.0 V at 806 for about 2.0 msec. Thus, the applied voltage at both the source and the gate is constant. The average leakage 808 is about 900 nA.

Figure 9:
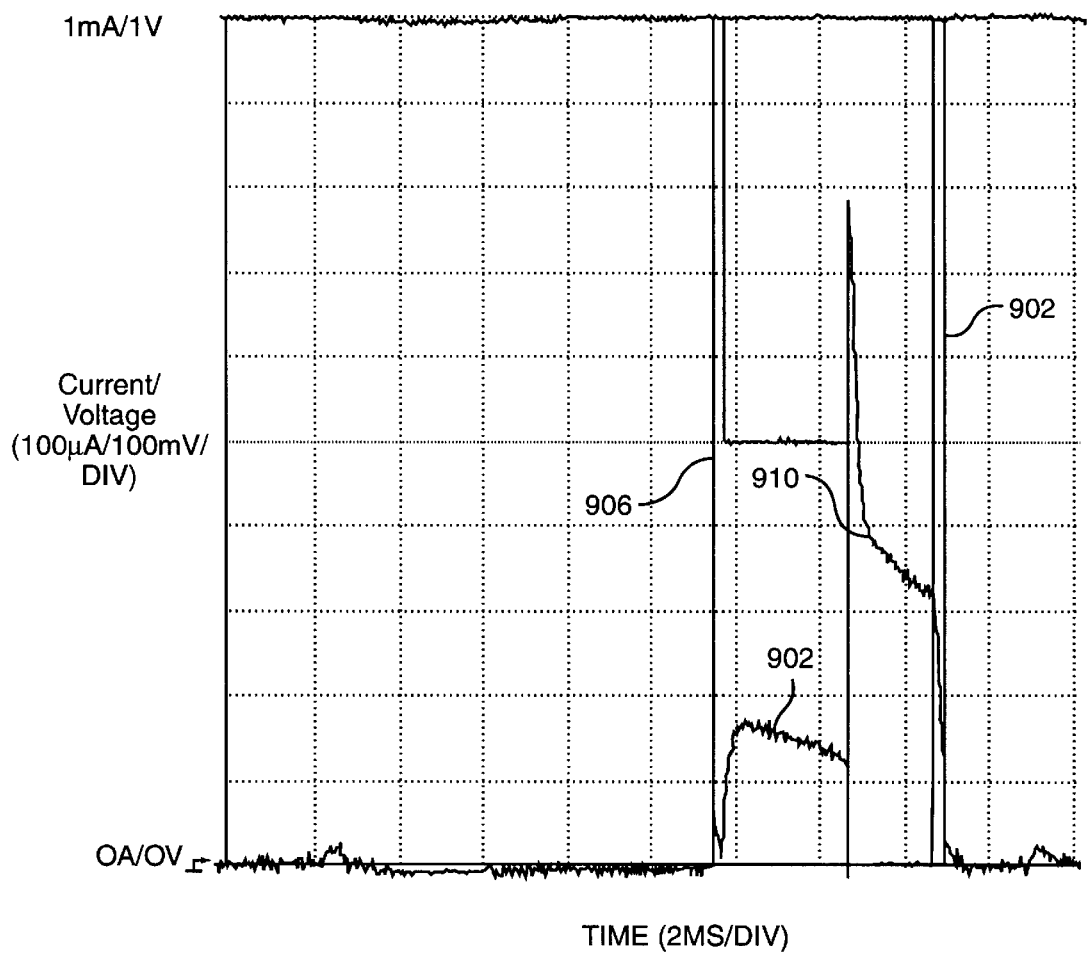
FIG. 9 illustrates a digitizing oscilloscope scan of source erasure using the method of the present invention.

FIG. 9 illustrates a digitizing oscilloscope scan using the method of the current invention for source erasure. The vertical axis represents voltage and current while the horizontal axis represents time. The resistance of the substrate used in this example was about 1 MΩ. Here, the voltage pulse 902 at the source is again about 5.0 V for a time interval of 5.5 msec and is offscale. The gate is pulsed first at about −5.0 V for about 3.0 msec and at about −10 V for about 2.0 msec at 906. The leakage is about 150 nA for the first pulse at 908 and about 350 nA at 910 for the second pulse.

This above example shows the efficacy of the method of the present invention in reducing source diode leakage during source erasure.

Figure 1:
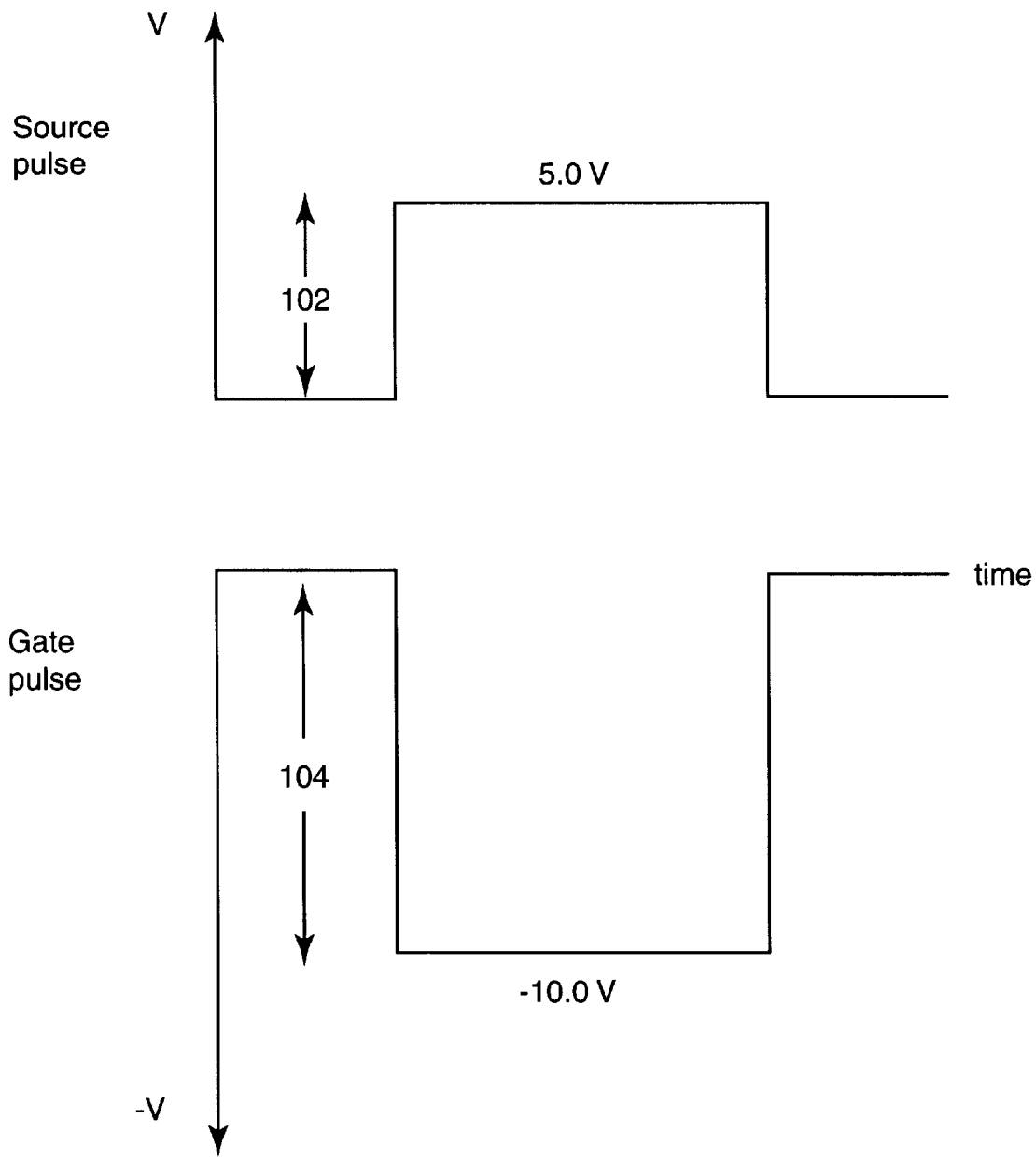
FIG. 1 illustrates conventional source and gate pulse profiles as a function of time.
Figure 2:
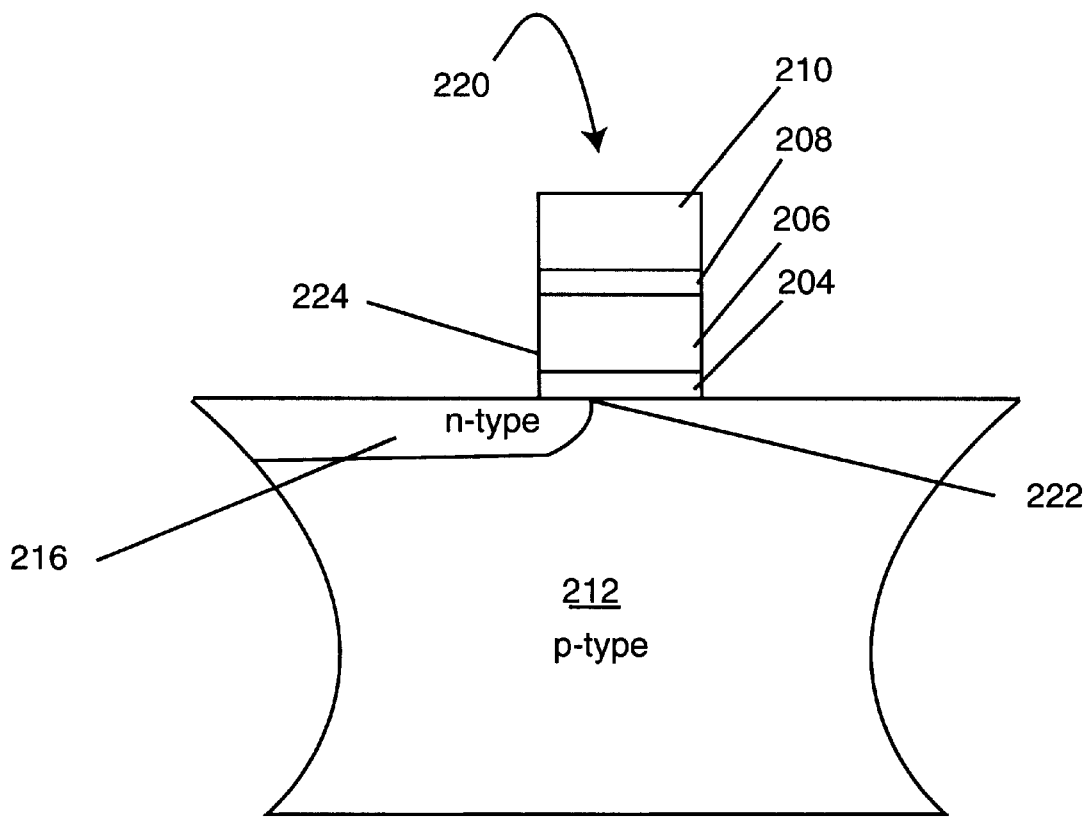
FIG. 2 illustrates a conventional stacked gate on a semiconductor substrate.
Figure 3:
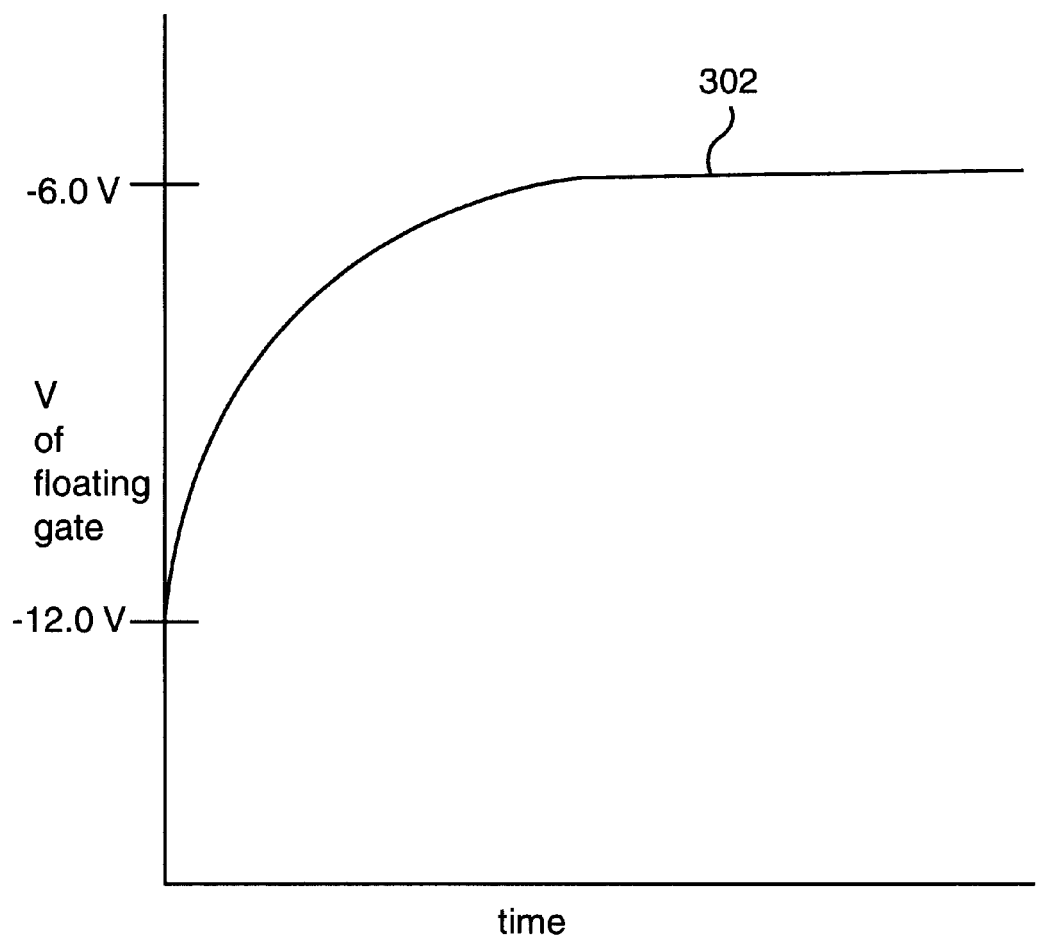
FIG. 3 illustrates the dependence of floating gate voltage on time.
Figure 4:
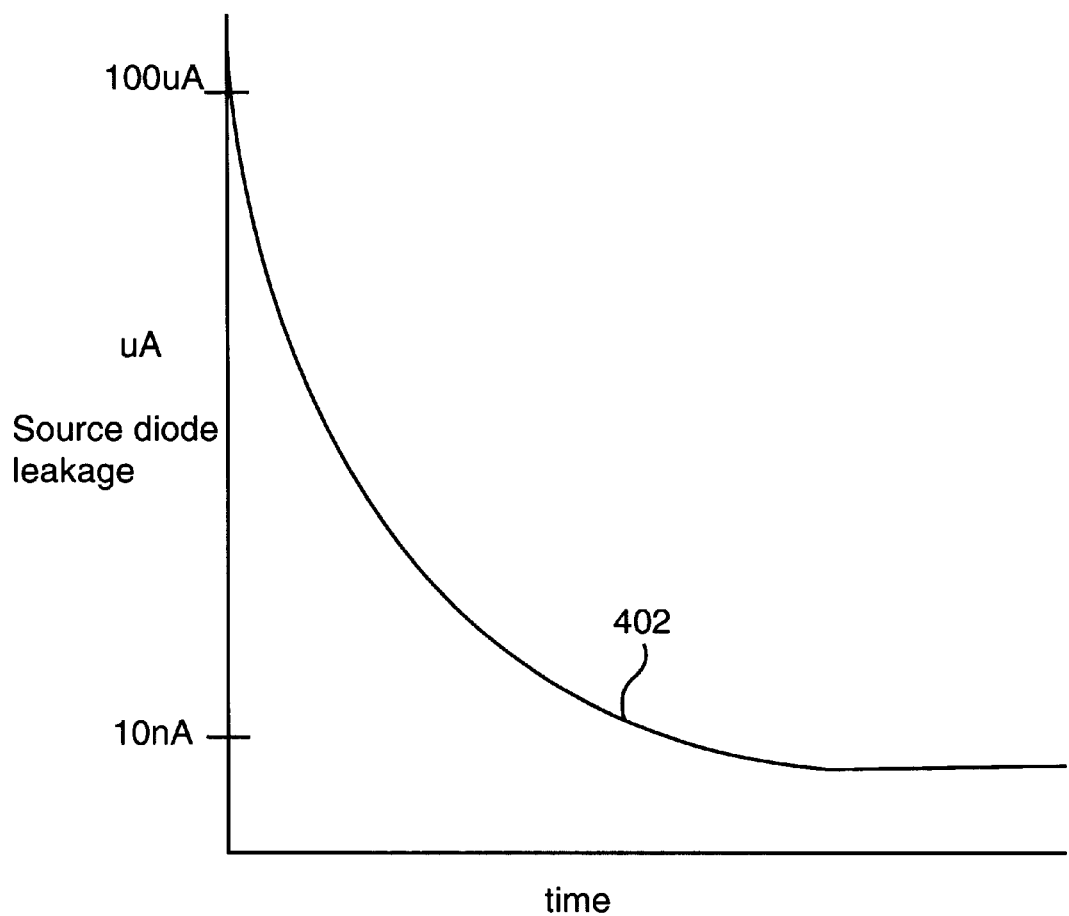
FIG. 4 illustrates the dependence of source diode leakage on time.

The described embodiments of the present invention offer significant advantages over the prior art. FIG. 4 demonstrated that a significant amount of source diode leakage occurred immediately following initial application of voltage to the control gate. The method of the current invention provides a first voltage pulse of low magnitude to the gate of the semiconductor device, which reduces the initial electric field in the floating gate in comparison to prior art methods. Consequently, source diode leakage to the substrate is significantly diminished. Then, after the voltage of the floating gate has declined to a substantially constant value, a second voltage pulse of high magnitude is applied to the gate of the semiconductor device. Thus, the method of the present invention offers the advantage of rapid source erase with a high magnitude voltage pulse and low source diode leakage. Furthermore, the method of the current invention is most useful in modern semiconductor devices of decreasing channel length where the capacity of source charge pumps is particularly limited.

Although the foregoing invention has been described in some detail for purposes of clarity of understanding, it will be apparent that certain changes and modifications may be practiced within the scope of the appended claims.

Furthermore, it should be noted that there are alternative ways of implementing the process of the present invention. For example, the gate pulse profile illustrated in FIG. 7 could be combined with the source profile illustrated in FIG. 5. Different time intervals and voltages could be used to implement the current invention. Accordingly, the present embodiments are to be considered as illustrative and not restrictive, and the invention is not to be limited to the details given herein, but may be modified within the scope and equivalents of the appended claims.

What is claimed is:

1. A method for erasing a semiconductor device comprising:
    applying a voltage pulse at the source of the semiconductor device; and
    applying a multiple step voltage pulse of the opposite polarity, said multiple step voltage pulse having at least a first voltage pulse and a second voltage pulse, at the gate of the semiconductor device;
    wherein said second voltage pulse is greater in magnitude than said first voltage pulse.

2. The method of claim 1, wherein the multiple step voltage pulse comprises:
    applying the first voltage pulse for a first time interval; and
    applying the second voltage pulse for a second time interval;
    wherein the first and second time intervals are substantially coincident with applying the voltage pulse at the source of the semiconductor device.

3. The method of claim 1, wherein the voltage pulse at the source of the semiconductor device is between about 4.0 V and about 6.0 V.

4. The method of claim 1, wherein the voltage pulse at the source of the semiconductor device is about 5.0 V.

5. The method of claim 1, wherein the voltage pulse at the source of the semiconductor device comprises applying for a third time interval.

6. The method of claim 5, wherein the third time interval is between about 100 $\mu$sec and about 100 msec.

7. The method of claim 5, wherein the third time interval is about 500 $\mu$sec.

8. The method of claim 1, wherein the first voltage pulse is between about −4.0 V and about −6.0 V.

9. The method of claim 1, wherein the first voltage pulse is about −5.0 V.

10. The method of claim 1, wherein the second voltage pulse is between about −9.0 V and about −11.0 V.

11. The method of claim 1, wherein the second voltage pulse is about −10.0 V.

12. The method of claim 2, wherein the first time interval is between about 250 $\mu$sec and about 500 $\mu$sec.

13. The method of claim 2, wherein the first time interval is about 300 $\mu$sec.

14. The method of claim 2, wherein the second time interval is between about 100 $\mu$sec and about 300 $\mu$sec.

15. The method of claim 2, wherein the second time interval is about 200 $\mu$sec.

16. The method of claim 1, wherein the voltage pulse at the source of the semiconductor device further comprises:
    applying a third voltage pulse for a first time interval; and
    applying a substantially identical fourth voltage pulse for a third time interval;
    wherein the first time interval and the third time interval are separated by a second time interval during which no voltage is applied to the source of the semiconductor device.

17. The method of claim 16, wherein the third voltage pulse and the fourth voltage pulse are about 5.0 V.

18. The method of claim 16, wherein the first time interval is substantially identical to the third time interval.

19. The method of claim 16, wherein the first time interval and the third time interval are greater than the second time interval.

20. The method of claim 16, wherein the first time interval is between about 100 μsec and about 300 μsec, the second time interval is between about 10 μsec and about 30 μsec and the third time interval is between about 100 μsec and about 300 μsec.

21. The method of claim 16, wherein the first time interval is about 200 μsec, the second time interval is about 20 μsec and the third time interval is about 200 μsec.

22. The method of claim 16, wherein the multiple step voltage pulse at the gate of the semiconductor device comprises:

applying the first voltage pulse for a fourth time interval; and applying the second voltage pulse for a sixth time interval;

wherein the first voltage pulse and the second voltage pulse are separated by a fifth time interval during which no voltage is applied to the gate of the semiconductor device.

23. The method of claim 22, wherein the first voltage pulse is about −5.0 V and the second voltage pulse is about −10.0 V.

24. The method of claim 22, wherein the fourth time interval is between about 100 μsec and about 300 μsec, the fifth time interval is between about 10 μsec and about 30 μsec and the sixth time interval is between about 100 μsec and about 300 μsec.

25. The method of claim 22, wherein the fourth time interval is about 200 μsec, the fifth time interval is about 20 μsec and the sixth time interval is about 200 μsec.

26. A method for erasing a semiconductor device comprising:

applying a constant positive voltage pulse for a first time interval at the source of the semiconductor device;

applying a first negative voltage pulse for a second time interval at the gate of the semiconductor device; and applying a second negative voltage pulse for a third time interval at the gate of the semiconductor device;

wherein said second negative voltage pulse is greater in magnitude than said first negative voltage pulse.

27. The method of claim 26, wherein the constant positive voltage pulse is about 5.0 V.

28. The method of claim 26, wherein the first negative voltage pulse is about −5.0 V and the second negative voltage pulse is about −10.0 V.

* * * * *

(12) EX PARTE REEXAMINATION CERTIFICATE (9428th)
United States Patent
Ratnam

(10) Number: US 6,236,608 C1
(45) Certificate Issued: Nov. 29, 2012

(54) TECHNIQUE TO IMPROVE THE SOURCE LEAKAGE FOR FLASH EPROM CELL DURING SOURCE ERASE

(75) Inventor: Perumal Ratnam, Fremont, CA (US)

(73) Assignee: Fast Memory Erase LLC, Addison, TX (US)

Reexamination Request:
No. 90/010,426, Feb. 26, 2009

Reexamination Certificate for:
Patent No.: 6,236,608
Issued: May 22, 2001
Appl. No.: 09/375,702
Filed: Aug. 16, 1999

(51) Int. Cl.
*G11C 13/00* (2006.01)
(52) U.S. Cl. .......................... 365/218; 365/226
(58) Field of Classification Search ............. None
See application file for complete search history.

(56) References Cited

To view the complete listing of prior art documents cited during the proceeding for Reexamination Control Number 90/010,426, please refer to the USPTO's public Patent Application Information Retrieval (PAIR) system under the Display References tab.

*Primary Examiner* — Tuan H Nguyen

(57) ABSTRACT

In one aspect, the present invention provides a method for erasing a semiconductor device that comprises applying a voltage pulse at the source of the semiconductor device and a multiple step voltage pulse of the opposite polarity at the gate of the semiconductor device. The multiple step voltage pulse comprises at least a first voltage pulse and a second voltage pulse at the gate of the semiconductor device. The second voltage pulse is usually greater in magnitude than the first voltage pulse. In another aspect, the present invention provides a method for erasing a semiconductor device that comprises applying a substantially constant positive voltage pulse for a first time interval, $t_1$, at the source of the semiconductor device. A first and then a second negative voltage pulse are also applied at the gate of the semiconductor device for a second and third time interval, $t_2$ and $t_3$, respectively. The second negative voltage pulse is greater in magnitude than the first negative voltage pulse. The negative and positive voltage pulses are substantially coincident in time.

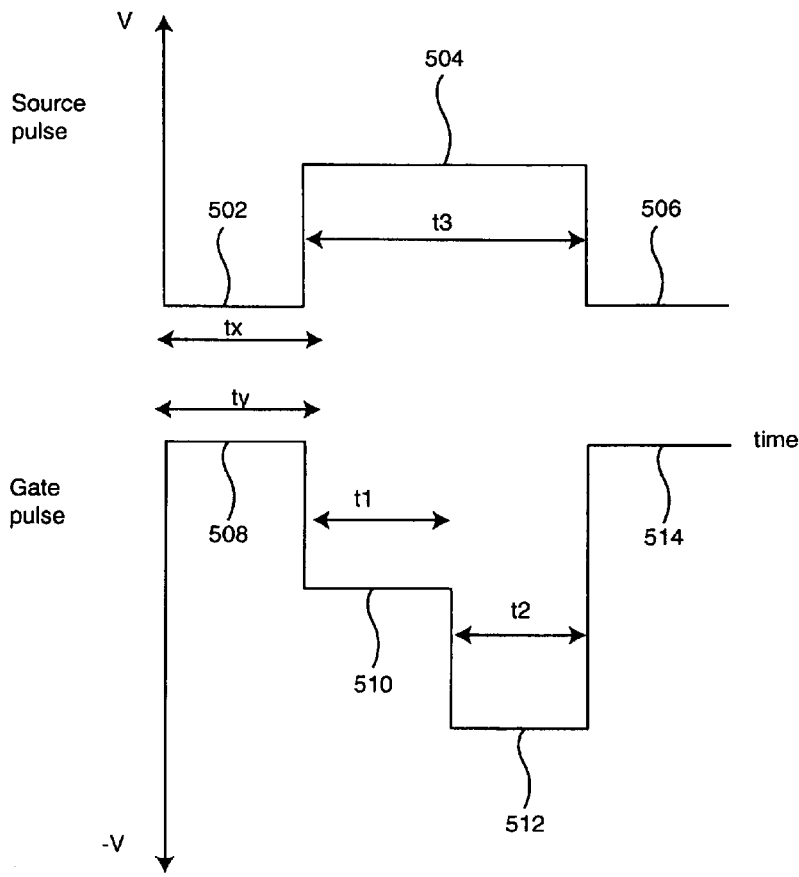

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claim 16, dependent on an amended claim, is determined to be patentable.

New claims 29-49 are added and determined to be patentable.

Claims 2-15 and 17-28 were not reexamined.

1. A method for erasing a semiconductor device comprising:
   applying a voltage pulse at the source of the semiconductor device, *wherein said pulse comprises a rapid increase in magnitude of voltage which is sustained for an interval of time followed by a rapid decay in magnitude of voltage*; and
   applying a multiple step voltage pulse of the opposite polarity, said multiple step voltage pulse having at least a first voltage pulse and a second voltage pulse, at the gate of the semiconductor device;
   *wherein each of said first and second voltage pulses comprises a rapid increase in magnitude of voltage which is sustained for an interval of time followed by a rapid decay in magnitude of voltage; and*
   wherein said second voltage pulse is greater in magnitude than said first voltage pulse.

29. *The method of claim 1, wherein the step of applying said multiple step voltage pulse of the opposite polarity at the gate of the semiconductor device further comprises:*
    *applying said first voltage pulse for a first time interval;*
    *applying said second voltage pulse for a third time interval; and*
    *applying a third voltage pulse for a fifth time interval, wherein said third voltage pulse comprises a rapid increase in magnitude of voltage which is sustained for an interval of time followed by a rapid decay in magnitude of voltage;*
    *wherein said third voltage pulse is greater in magnitude than said second voltage pulse; and*
    *wherein said first time interval and said third time interval are separated by a second time interval during which no voltage is applied to the gate of the semiconductor device; and*
    *wherein said third time interval and said fifth time interval are separated by a fourth time interval during which no voltage is applied to the gate of the semiconductor device.*

30. *The method of claim 1, wherein the portion of said voltage pulse applied at the source of the semiconductor device between said rapid increase in magnitude of voltage and said rapid decrease in magnitude of voltage is substantially constant in voltage.*

31. *A method for erasing a semiconductor device comprising:*
    *applying a voltage pulse at the source of the semiconductor device, which comprises applying a third voltage pulse for a first time interval, and applying a substantially identical fourth voltage pulse for a third time interval, wherein the first time interval and the third time interval are separated by a second time interval during which no voltage is applied to the source of the semiconductor device; and*
    *applying a multiple step voltage pulse of the opposite polarity, said multiple step voltage pulse having at least a first voltage pulse and a second voltage pulse, at the gate of the semiconductor device;*
    *wherein said second voltage pulse is greater in magnitude than said first voltage pulse.*

32. *The method of claim 31, wherein the third voltage pulse and the fourth voltage pulse are about 5.0 V.*

33. *The method of claim 31, wherein the first time interval is substantially identical to the third time interval.*

34. *The method of claim 31, wherein the multiple step voltage pulse at the gate of the semiconductor device comprises:*
    *applying the first voltage pulse for a fourth time interval; and*
    *applying the second voltage pulse for a sixth time interval;*
    *wherein the first voltage pulse and the second voltage pulse are separated by a fifth time interval during which no voltage is applied to the gate of the semiconductor device.*

35. *The method of claim 34, wherein the first voltage pulse is about −5.0 V and the second voltage pulse is about −10.0 V.*

36. *The method of claim 22, wherein at least a portion of the second time interval is simultaneous with at least a portion of the fifth time interval.*

37. *The method of claim 34, wherein at least a portion of the second time interval is simultaneous with at least a portion of the fifth time interval.*

38. *The method of claim 31, wherein said third and fourth voltage pulses comprise a rapid increase in magnitude of voltage which is sustained for an interval of time, followed by a rapid decrease in magnitude of voltage, and wherein the portion of said third voltage pulse between said rapid increase in magnitude of voltage and said rapid decrease in magnitude of voltage is substantially constant in voltage and the portion of said fourth voltage pulse between said rapid increase in magnitude of voltage and said rapid decrease in magnitude of voltage is substantially constant in voltage.*

39. *The method of claim 31, wherein the first time interval and the third time interval are greater than the second time interval.*

40. *The method of claim 31, wherein the first time interval is between about 100 μsec and about 300 μsec, the second time interval is between about 10 μsec and about 30 μsec and the third time interval is between about 100 μsec and about 300 μsec.*

41. *The method of claim 31, wherein the first time interval is about 200 μsec, the second time interval is about 20 μsec and the third time interval is about 200 μsec.*

42. *The method of claim 34, wherein the fourth time interval is between about 100 μsec and about 300 μsec, the fifth time interval is between about 10 μsec and about 30 μsec and the sixth time interval is between about 100 μsec and about 300 μsec.*

43. The method of claim 34, wherein the fourth time interval is about 200 μsec, the fifth time interval is about 20 μsec and the sixth time interval is about 200 μsec.

44. The method of claim 1, wherein the multiple step voltage pulse further comprises:

applying the first voltage pulse for a time interval; and wherein the time interval is between about 250 μsec and about 500 μsec.

45. The method of claim 1, wherein the multiple step voltage pulse further comprises:

applying the first voltage pulse for a time interval; and wherein the time interval is about 300 μsec.

46. The method of claim 1, wherein the multiple step voltage pulse further comprises:

applying the second voltage pulse for a time interval; and wherein the time interval is between about 100 μsec and about 300 μsec.

47. The method of claim 1, wherein the multiple step voltage pulse further comprises:

applying the second voltage pulse for a time interval; and wherein the time interval is about 200 μsec.

48. The method of claim 22, wherein the duration of the fourth time interval is at least about 10 times greater than the duration of the fifth time interval.

49. The method of claim 34, wherein the duration of the fourth time interval is at least about 10 times greater than the duration of the fifth time interval.

* * * * *